United States Patent
Hubris et al.

(10) Patent No.: US 8,898,549 B2
(45) Date of Patent: Nov. 25, 2014

(54) STATISTICAL ADAPTIVE ERROR CORRECTION FOR A FLASH MEMORY

(71) Applicant: LSI Corporation, San Jose, CA (US)

(72) Inventors: Alexander Hubris, San Jose, CA (US); Hao Zhong, Los Gatos, CA (US)

(73) Assignee: Seagate Technology LLC, Cupertino, CA (US)

( * ) Notice: Subject to any disclaimer, the term of this patent is extended or adjusted under 35 U.S.C. 154(b) by 60 days.

(21) Appl. No.: 13/765,034

(22) Filed: Feb. 12, 2013

(65) Prior Publication Data

US 2014/0229799 A1   Aug. 14, 2014

(51) Int. Cl.
 *H03M 13/00*   (2006.01)
 *G06F 11/10*   (2006.01)
 *H04L 1/00*   (2006.01)
 *H03M 13/35*   (2006.01)

(52) U.S. Cl.
 CPC .............. *G06F 11/10* (2013.01); *H04L 1/0009* (2013.01); *H03M 13/35* (2013.01)
 USPC ........... 714/774; 714/704; 714/755; 714/708; 714/752; 714/751; 365/185.09

(58) Field of Classification Search
 None
 See application file for complete search history.

(56) References Cited

U.S. PATENT DOCUMENTS

| | | | |
|---|---|---|---|
| 4,335,459 A * | 6/1982 | Miller | 714/755 |
| 6,477,669 B1 * | 11/2002 | Agarwal et al. | 714/708 |
| 7,210,077 B2 * | 4/2007 | Brandenberger et al. | 714/708 |
| 7,328,394 B2 * | 2/2008 | Fa et al. | 714/776 |
| 8,125,827 B2 | 2/2012 | Park | 365/185.09 |
| 8,266,481 B2 | 9/2012 | Moshayedi | 714/710 |
| 8,281,064 B2 | 10/2012 | Oh et al. | 711/103 |
| 2005/0283650 A1 * | 12/2005 | Zhang et al. | 714/6 |
| 2008/0254749 A1 * | 10/2008 | Ashkenazi et al. | 455/69 |
| 2010/0125764 A1 * | 5/2010 | Kose | 714/704 |
| 2010/0241928 A1 * | 9/2010 | Kim et al. | 714/763 |
| 2011/0060967 A1 | 3/2011 | Warren | 714/773 |
| 2011/0060968 A1 | 3/2011 | Warren | 714/773 |
| 2011/0252289 A1 * | 10/2011 | Patapoutian et al. | 714/763 |
| 2013/0047045 A1 * | 2/2013 | Hu et al. | 714/708 |
| 2013/0179748 A1 * | 7/2013 | DONG et al. | 714/755 |

* cited by examiner

*Primary Examiner* — John Trimmings
(74) *Attorney, Agent, or Firm* — Christopher P. Maiorana, PC (57) ABSTRACT

A method for implementing adaptive error correction in a memory, comprising the steps of (A) decoding a page of data read from a memory, (B) selecting one of a plurality of histograms based on a measured code word error rate of the decoded page and (C) applying an error correction code rate based on the selected histogram. The error correction code rate allows the memory to use a minimum number of error correction bits to provide reliable operation of the memory.

20 Claims, 6 Drawing Sheets

STATISTICAL ADAPTIVE ERROR CORRECTION FOR A FLASH MEMORY

FIELD OF THE INVENTION

The present invention relates to memory storage generally and, more particularly, to a method and/or apparatus for implementing a statistical adaptive error correction in a flash memory device.

BACKGROUND OF THE INVENTION

Conventional flash memory devices degrade over time as the device is programmed/erased and read. Vendors of flash memory devices publish data sheets listing a recommended worse case Error Correction Code (ECC) rate for each flash memory device that guarantees data integrity over a guaranteed program/erase cycle. However, at the beginning of the life cycle of a flash device, the flash device is not subject to as many bit errors, and does not need the correction power recommended by the flash vendors. Over the lifetime of a flash memory device, the flash memory device degrades and needs a lower ECC rate.

It would be desirable to implement a statistical adaptive error correction system for a flash memory device

SUMMARY OF THE INVENTION

A method for implementing adaptive error correction in a memory, comprising the steps of (A) decoding a page of data read from a memory, (B) selecting one of a plurality of histograms based on a measured code word error rate of the decoded page and (C) applying an error correction code rate based on the selected histogram. The error correction code rate allows the memory to use a minimum number of error correction bits to provide reliable operation of the memory.

The features and advantages of the present invention include providing statistical adaptive error correction that may (i) be used in a flash memory device, (ii) provide Bin Flash Page Errors into E-PAGE error bucket bins, (iii) provide a segmented memory to generate multiple histograms, (iv) change ECC rates according to peak bucket bin thresholds, and/or (v) be easy to implement.

BRIEF DESCRIPTION OF THE DRAWINGS

These and other features and advantages of the present invention will be apparent from the following detailed description and the appended claims and drawings in which:

DETAILED DESCRIPTION OF THE PREFERRED EMBODIMENTS

Embodiments of the invention concern a memory device, such as NAND flash, used an array of floating gate transistors, called cells, to store information. As the flash memory device is programmed and erased over a useful lifetime, the expected error rate increases. The errors can be corrected by using some type of error correction such as Reed Solomon, BCH, LDPC, etc. For error correction coding with variable rates implemented, optimizing the code rate chosen so that the overhead for the correction power is minimized while still maintaining data integrity would be desirable. Embodiments of the invention provide an apparatus or method to predict and/or determine when to change Error Correction Code (ECC) rates over the lifetime of the flash.

Flash memory devices are often made with one or more planes, with each plane subdivided into a number of blocks, such as 1024 blocks. Each block is further subdivided into flash pages, such as 128 flash pages. Each flash page includes a number of bytes used for data and/or ECC. A flash page can be conceptualized into error correction pages (E-PAGES) which are sub-pages of the flash page with user data being protected by data redundancy/parity (e.g., ECC). As the E-PAGES are read back and corrected for errors, the programming/read lifetime errors can be charted statistically in error buckets detailing how many errors exist in the various E-PAGES. Analysis shows that one major cause of the read error of flash memory is the degradation of the flash memory over a programming/read lifetime. Over the lifetime of the flash device, the errors can be charted based on error buckets (e.g., bins that show how many errors exist in each of the E-PAGES).

Figure 1:
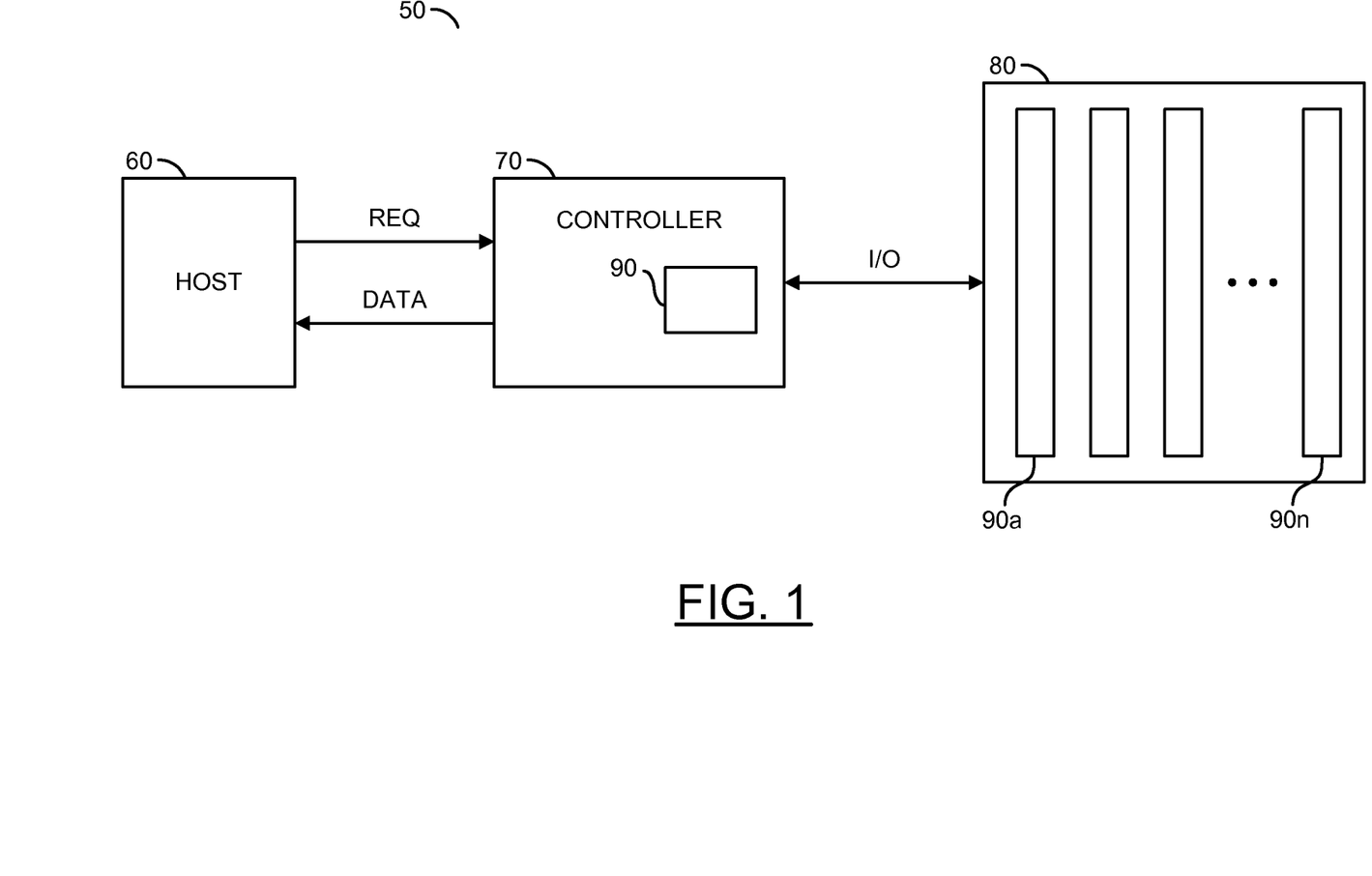
FIG. 1 is a diagram illustrating a context of the invention.

Referring to FIG. 1, a block diagram of an example apparatus 50 is shown. The apparatus 50 may implement a computer having a nonvolatile memory circuit. The apparatus 50 generally comprises a block (or circuit) 60, a block (or circuit) 70 and a block (or circuit) 80. The circuit 70 may include a circuit 90. The circuit 90 may be a memory configured to store computer instructions (or firmware).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to the circuit 80. The signal REQ may include one or more address bits. A signal (e.g., DATA) may be one or more data portions received by the circuit 80.

The circuit 60 is shown implemented as a host circuit. The circuit 70 reads and writes data to and from the circuit 80. The circuit 80 is generally implemented as a nonvolatile memory circuit. The circuit 80 may include a number of modules 90a-90n. The modules 90a-90n may be implemented as NAND flash chips. In some embodiments, the circuit 80 may be a NAND flash device. In other embodiments, the circuit 70 and/or the circuit 80 may be implemented as all or a portion of a solid state drive having one or more nonvolatile devices. The circuit 80 is generally operational to store data in a nonvolatile condition. When data is read from the circuit 80, the circuit 70 may access a set of data (e.g., multiple bits) identified in the signal REQ.

In some embodiments, the circuit 80 may be implemented as a single-level cell (e.g., SLC) type circuit. An SLC type circuit generally stores a single bit per memory cell (e.g., a logical 0 or 1). In other embodiments, the circuit 80 may be implemented as a multi-level cell (e.g., MLC) type circuit. An MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111).

Figure 2:
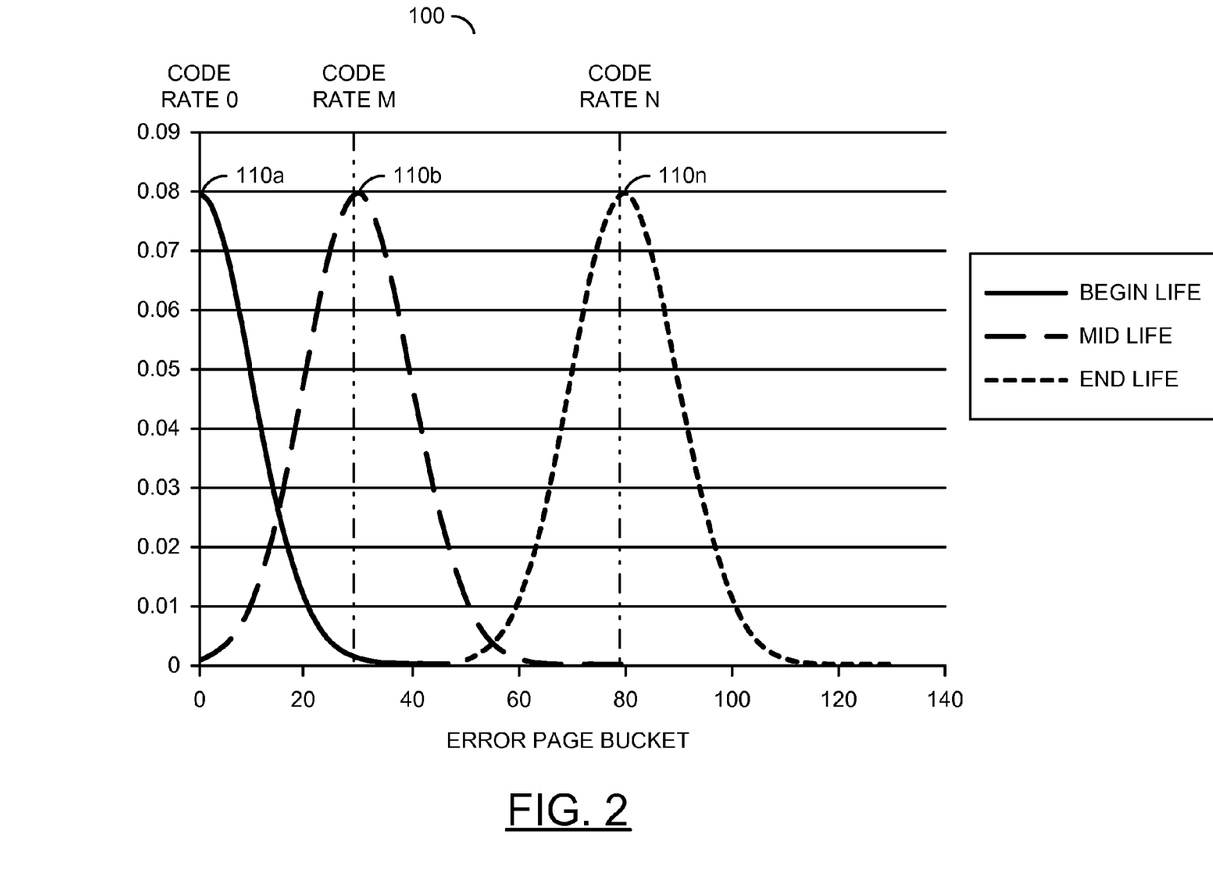
FIG. 2 shows a code rate selection based on a number of statistical histograms.

Referring to FIG. 2, a block diagram of a histogram 100 is shown in accordance with an embodiment of the present invention. The graph histogram 100 shows a typical distribution of error E-PAGES over the lifetime of the flash device 80.

At the beginning of the life of a memory, the number of errors per E-PAGE is binned into buckets holding less than 10 errors. As the flash is used over a life-cycle, the distribution is shifted to the right falling into larger and larger error buckets near the end of life. The distribution may also get broader towards the end of life.

Figure 3:
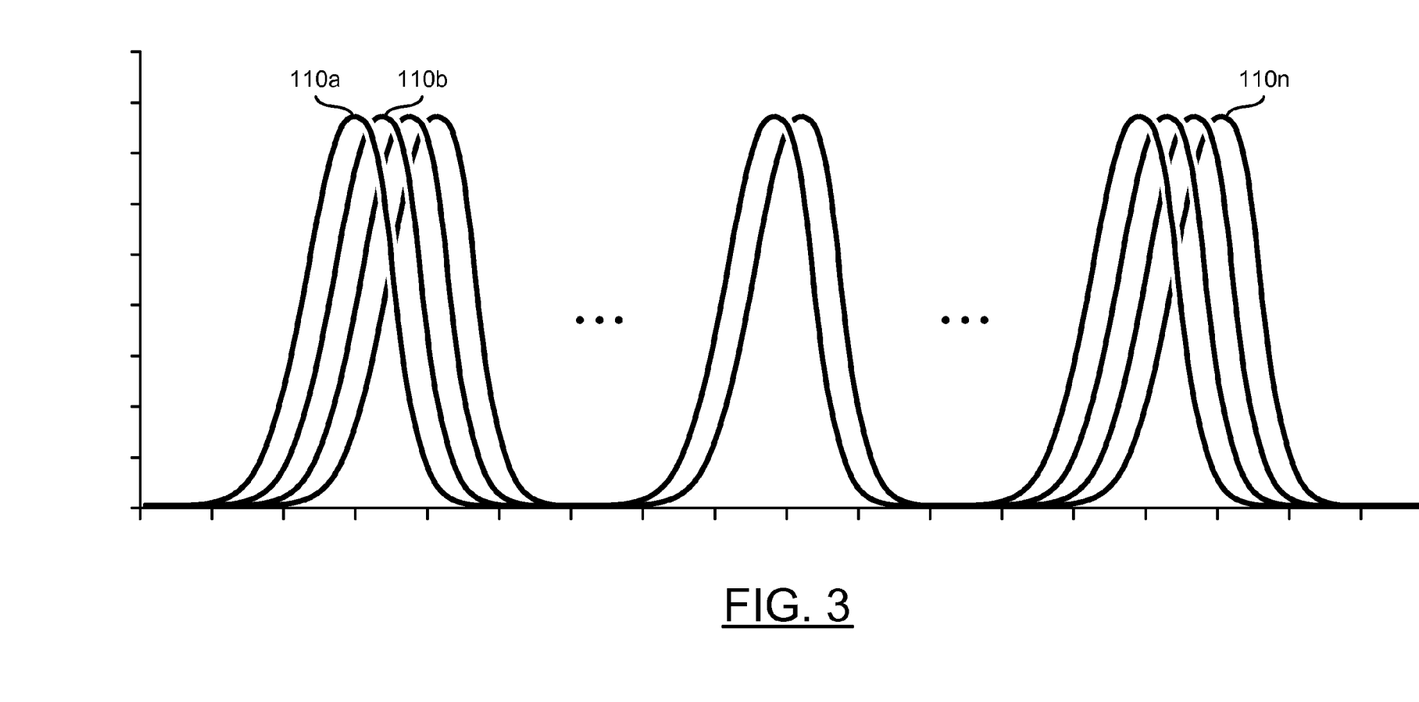
FIG. 3 shows a plurality of statistical E-PAGE error bucket histograms.

Referring to FIG. 3, a block diagram of a plurality of histograms 110a-110n is shown in accordance with an embodiment of the present invention. In the example shown, n may be an integer value representing the number of histograms 110a-110n. In one example, 64 histograms (or buckets) may be implemented. However, the particular number of buckets may be varied to meet the design criteria of a particular implementation. The histogram 110a may be used during an early life of a memory. The histogram 110a may use a code rate 0. The histogram 110b may be used during a mid-life of a memory. The histogram 110b may use a code rate m. The histogram 110n may be used near an end of life of a memory. The histogram 110n may use a code rate n. The histogram 110a may trail off at around 20 bit errors using the code rate 0, which may represent 112 bytes of error correction. The code rate m may be varied according to a particular mid-life implementation. The code rate n, may use 496 bytes of error correction. The code rate n may be the lowest code rate used near the end of life of a memory. The code rate n may correct for 100+ bit errors.

An embodiment of the invention creates a statistical E-PAGE error histogram in hardware to detect and/or quantify the error rate over the operating life of the Flash device and/or variably change the error code rate to optimize the error correction power and bandwidth efficiency. The histogram hardware can then be used to adaptively select the code rate used for error correction in order to maximize reliability and/or bandwidth of the Flash read/write operation where variable code rate correction power is implemented. The graph of FIG. 3 demonstrates how the code rates can be chosen once a number of flash devices 80, possibly received from different vendors, are characterized. At the beginning of life, the highest code rate (e.g., CODE RATE 0) may be used. Lower code rates may be used over the lifetime of the device (e.g., code rate M at mid-life and a code rate N at end of life).

The ability to detect the degradation of the device 80 and to chose the optimal code rate will reduce the probability of data corruption and/or low throughput for flash channel (e.g., the circuit 70 and/or the circuit 80). An optimal code rate may be chosen in order to improve bandwidth throughput for the flash channel. Choosing an optimal code rate may also protect the data from corruption. For example, at the beginning of the life of the device 80, a flash page may have only 1-16 bits of errors. At the middle of life, the same device 80 may have 20-30 bits of errors. At the end of life of the same device 80, over 160 bits of errors may occur. All stages of life may be protected by the lowest code rate, which adds roughly 496 bytes (3968 bits) of ECC protection. However, such a code rate may not be optimal for use at the beginning of flash life which might only need the highest code rate of 112 bytes (896 bits) of ECC protection. Using the highest code rate (e.g., 112 bytes of ECC protection) only uses 7 rows of parity of processing to be calculated, taking up only 112 clock cycles. Using the lowest code rate (e.g., 496 bytes of ECC), uses 31 rows of parity, or 496 clock cycles. Clock cycles generally equate to bandwidth. The more clock cycles needed to process errors, the less bandwidth left for processing I/O requests. Also, the less bytes written to be the flash device 80 without causing data corruption, the more the life of the flash device 80 is extended, since less overall flash pages are used to store the information.

Figure 4:
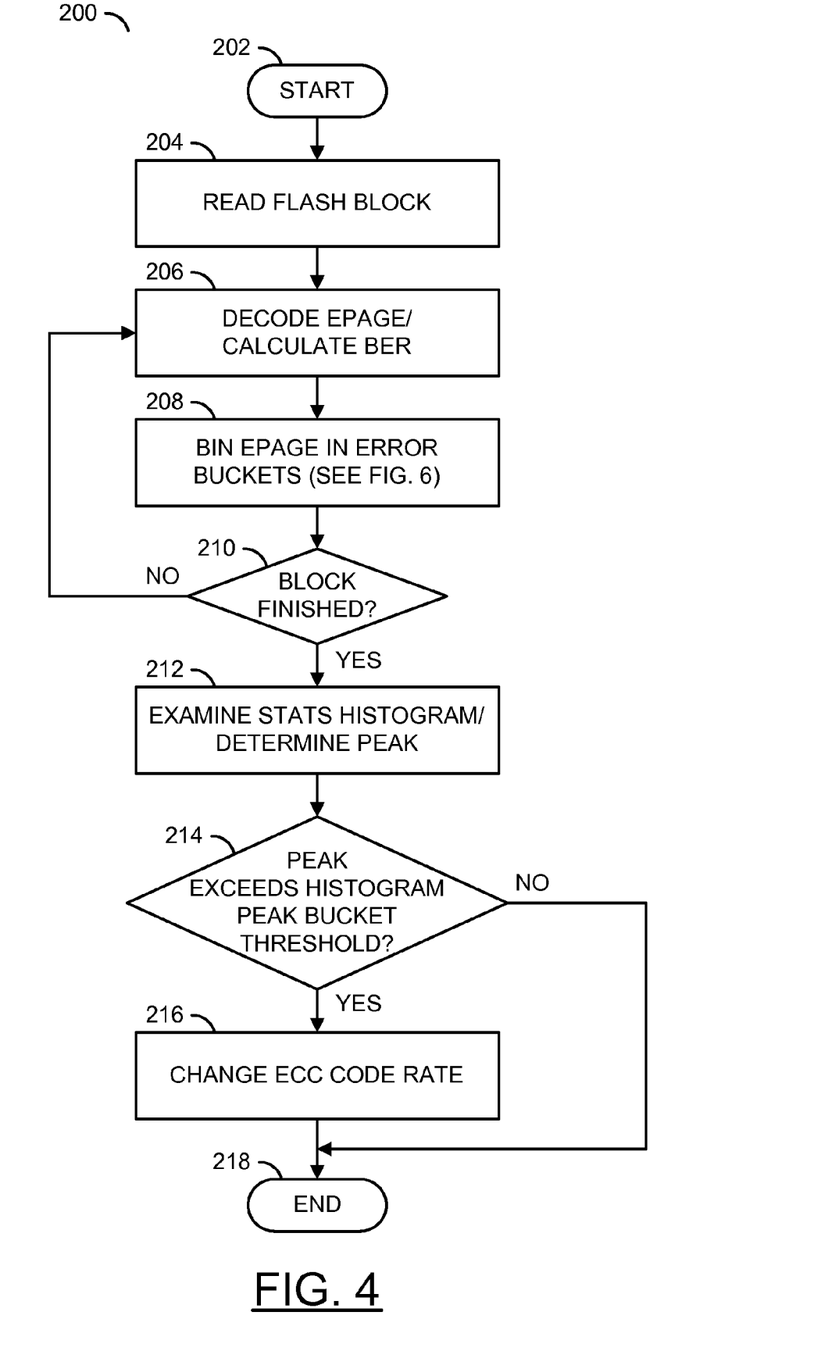
FIG. 4 is a flow diagram illustrating a code rate selection flow chart.

Referring to FIG. 4, a method (or process) 200 is shown implementing an ECC code rate selection for a flash memory device. The method 200 may be based on an E-PAGE histogram creation for a flash block. The method 200 generally comprises a step (or state) 202, a step (or state) 204, a decision step (or state) 206, a decision step (or state) 208, a step (or state) 210, a step (or state) 212, a step (or state) 214, a step (or state) 216, and a step (or state) 218. The step 202 may be a start state. The step 204 may read a flash block. The step 206 may decode an E-PAGE flash to calculate a bit error rate (BER). The step 208 may calculate a BIN E-PAGE in error buckets. The step 210 may determine if a block is finished. If not, the method 200 moves back to the state 206. If so, the method 200 moves to the state 212. The state 212 examines the statistics of the histogram and determines a peak value. Next, the decision state 214 determines if a peak exceeds a histogram peak bucket threshold. If not, the method 200 moves to the end state 218. If so, the method moves to the state 216. The state 216 charges an ECC code rate.

Figure 5:
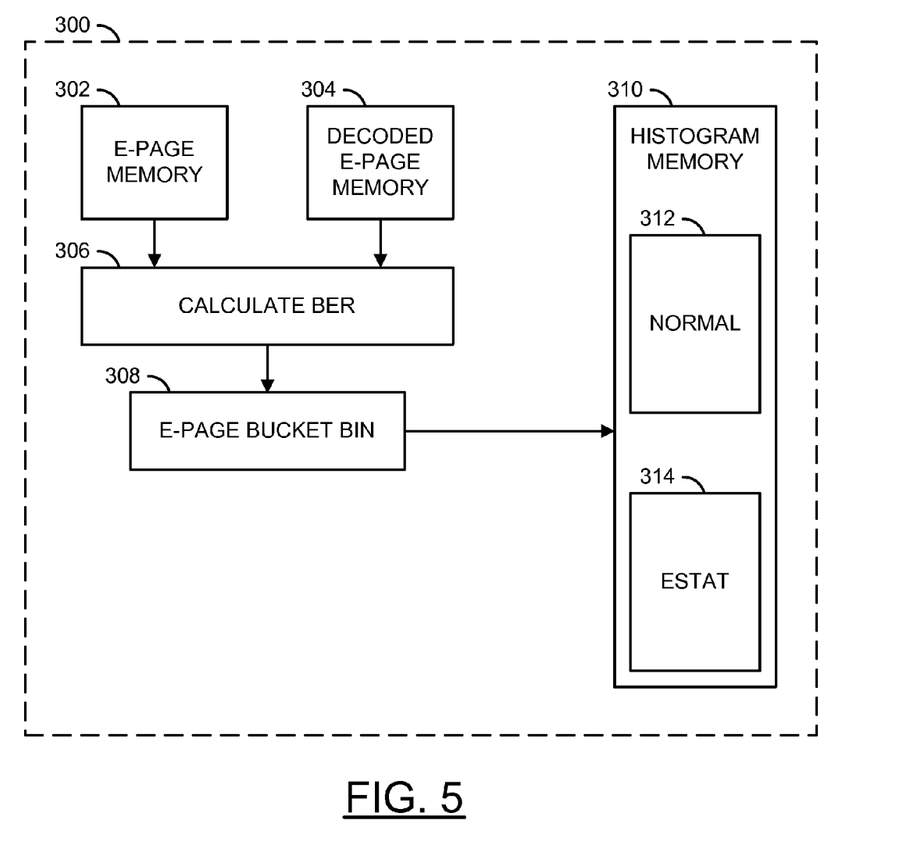
FIG. 5 is a diagram of an E-PAGE histogram circuit.

Referring to FIG. 5, a circuit 300 is shown. The circuit 300 illustrates a hardware implementation that may be used to generate an error histogram. The circuit 300 generally comprises a block (or circuit) 302, a block (or circuit) 304, a block (or circuit) 306, a block (or circuit) 308, a block (or circuit) 310. The circuit 310 may include a block (or circuit) 312 and a block (or circuit) 314. The circuit 302 may be implemented as an E-PAGE memory. The circuit 304 may be implemented as a decoded E-PAGE memory. The circuit 306 may be implemented as a circuit configured to calculate a BER value. The circuit 308 may be implemented as an E-PAGE bucket BIN circuit. The circuit 312 may be implemented as a normal memory segment. The circuit 314 may be implemented as an E-STATE memory segment.

The E-PAGE memory 302 may compare the raw E-PAGE values as read from the flash to the values in decoded E-PAGE 304 to calculate the BER. The circuit 306 may perform the comparison. The bits that do not match (because they were corrected) are sent to the circuit 308. Once the BER is calculated for the entire E-PAGE, the value for the E-PAGE is binned according to the size of the error compared against a programmable BUCKET_SIZE value to generate the histogram. Multiple histograms may be generated at one time by segmenting the histogram memory 301. The memory 310 is shown segmented into the NORMAL segment 312 and the ESTAT segment 314. Implementing memory segmentation to generate multiple histograms may allow better characterization of different flash blocks (or pages). For example, one separate histogram (or set of histograms) may be used during read scrubbing. The results of scrubbing certain regions may be evaluated as the scrubbing is done to determine a future code rate. In another example, prior to erasing a block of flash, the block may be statistically sampled using a dedicated one of the histograms to determine a current error rate. In another example, the sampling can be performed immediately after programming a block to detect errors that affect programming of the flash (which typically get worse with wear).

Figure 6:
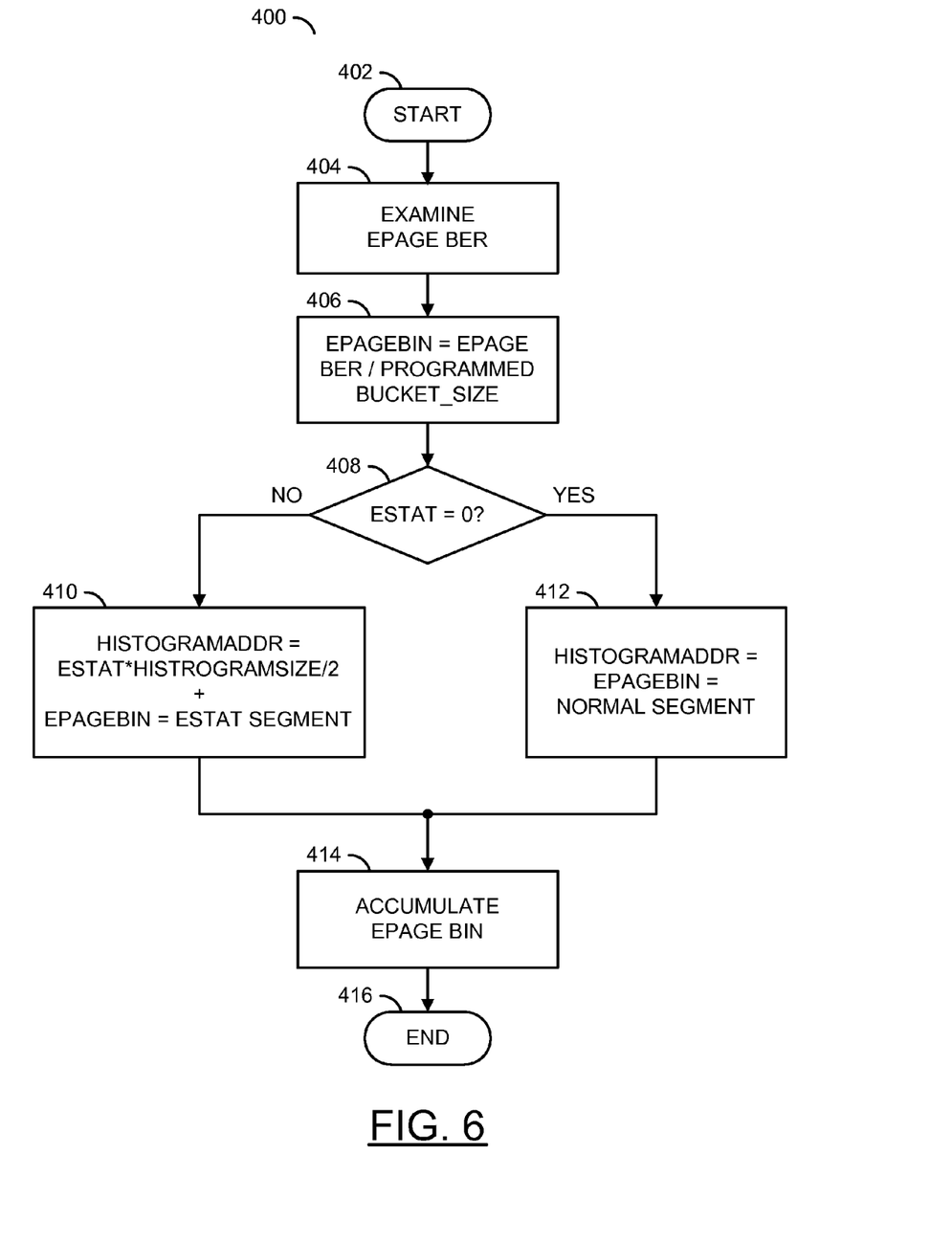
FIG. 6 is a flow diagram of a bucket BIN.

Referring to FIG. 6, a method 400 is shown. The method 400 may calculate an address value for the histogram memory 310 by showing an example operation of the E-PAGE Bucket BIN circuit 308. Once an address value is determined, the content of the address, which represents the number of E-PAGES with the error page BUCKET_SIZE, is accumulated in order to generate the histogram. The method 400 generally comprises a step (or state) 402, a step (or state) 404, a step (or state) 406, a decision step (or state) 408, a step (or state) 410, a step (or state) 412, a step (or state) 414, and a step (or state) 416. The state 402 may be a start state. The state 404 may examine an E-PAGE BER. The state 406 may set a value of E-PAGE BIN equal to E-PAGE BER divided by the programmed value BUCKET_SIZE. Next, the decision state 408 determines whether the value ESTATE=0. If so, the method 400 moves to the state 412. If not, the method 400 moves to the state 410. The state 410 sets a value HISTOGRAMADDR equal to ESTAT times the value HISTOGRAMSIZE/2. The state 400 also sets the value E-PAGE BIN equal to the value ESTAT_SEGMENT. The state 412 sets a value HISTOGRAMADDR equal to E-PAGE BIN, which is equal to a normal segment. Next, the state 414 accumulates an E-PAGE BIN. Next the state 416 ends the process 400.

The value BUCKET_SIZE represents the granularity for the histogram of the E-PAGES. For example, a value BUCKET_SIZE equal to 8 represents all of the E-PAGES with 0-7 errors if the value HISTOGRAMADDR is calculated to equal 0. A value HISTOGRAMADDR equal to 1 represents all of the E-PAGES with 8-15 errors. A value HISTOGRAMADDR of 3 represents all E-PAGES with 16-23 errors. And so on, until the maximum address for the segment which then represents all errors greater than the quotient times the value BUCKET_SIZE. The value BUCKET_SIZE enables a fixed number of buckets in the histogram to support a larger min-to-max range. For example, the value BUCKET_SIZE increases over a lifetime as a maximum number of expected errors increases.

For better statistical tracking, the histogram is segmented into NORMAL and ESTAT segments. The firmware 90 has the ability to set a bit in the decoder to generate statistics for the E-PAGE in either the NORMAL or ESTAT histogram memory segment. The difference is a calculation of the histogram address, as shown in the flow chart in FIG. 6. In other embodiments, the particular number of histograms may be selectable by hardware (or firmware).

Once a histogram is created, the firmware examines the histogram by reading all memory locations in a segment to find the peak in the memory segment being read. When the values in the memory segments are plotted, they should correlate to the Gaussian-like distribution curves (shown in FIG. 1) over the flash lifetime. As such, the peak value can be used to see if such a peak has passed a certain threshold. If the peak has crossed the peak value threshold for each of the variable code rates, then the corresponding code rate should be selected as shown in FIG. 2. The threshold will vary from vendor to vendor since not all flash quality is the same. However, all flash in a family from each vendor will often have the same characteristics, so such a flash memory can be characterized for different peak threshold detection.

While flash devices have been described, circuit 300 may be applied to various types of non-volatile memory that may be used in systems with variable ECC rates. One specific implementation uses variable LDPC ECC. However, other variable ECC techniques, such as REED SOLOMON, VITERBI, TURBO CODES, BCH, etc., may be implemented to meet the design criteria of a particular implementation.

In one example, two memory segments may be used to generate two different histograms simultaneously. However, the particular number of memory segments may be varied to create various histograms simultaneously so that firmware can track different NVM E-PAGES performance and/or code rate selection. The peak detection of the histogram may be filtered/averaged over various buckets in order to achieve a better ECC threshold crossing algorithm for code rate selection.

Analysis of the histogram other than via peak detection may also be implemented. In some embodiments, knowing where the top X % (e.g., 20%) of the error distribution can be used to determine a likelihood of an E-PAGE being uncorrectable (e.g., having more than a certain number of errors), which in turn can be used to select a code rate sufficient to reduce the decoding failure probability to a desired (or target) level. Such a technique may presume the histogram distributions are Gaussian or any type of statistical distribution.

The histograms can be generated based on planes rather than blocks or can be striped or reorganized in any NVM grouping as to better characterize the different E-PAGES for code rate selection. Any thresholds or limits may be specified in advance, or may be functions of other statistics tracked by firmware.

The functions performed by the diagrams of FIGS. 4 and 6 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. A method for implementing adaptive error correction in a memory, comprising the steps of:
    (A) decoding a page of data read from said memory;
    (B) selecting one of a plurality of histograms based on a measured code word error rate of said decoded page; and
    (C) applying an error correction code rate based on said selected histogram, wherein said error correction code rate allows said memory to use a minimum number of error correction bits needed to provide reliable operation of said memory.

2. The method according to claim 1, further comprising the steps of:
    repeating steps (A)-(C); and
    modifying said error correction code rate by selecting another of said plurality of histograms if said histogram exceeds a peak threshold of said selected histogram.

3. The method according to claim 1, wherein said error correction code rate comprises an Error Correction Code (ECC).

4. The method according to claim 1, wherein said minimum number of error correction bits increases as said memory ages.

5. The method according to claim 1, wherein said method increases a bandwidth performance of said memory by minimizing the number of error correction bits needed to provide reliable operation of said memory.

6. The method according to claim 1, wherein said method is implemented on a first portion of said memory to provide a first error correction rate and a second portion of said memory to provide a second error correction rate.

7. The method according to claim 1, wherein said reliable operation of said memory comprises writing to said memory without causing data corruption.

8. The method according to claim 1, wherein said memory comprises a flash memory.

9. The method according to claim 1, wherein step (A) comprises the sub-steps of:
    determining whether a parameter is equal to zero;
    setting a first value equal to a second value if said parameter is equal to zero; and
    setting said parameter equal to a parameter plus an offset if said parameter is not equal to zero.

10. An apparatus comprising:
    means for storing data; and
    means for processing a plurality of input/output requests to read/write data to/from said means for storing, wherein said means for processing is configured to (i) decode a page of data read from the means for storing data, (ii) select one of a plurality of histograms based on a measured code word error rate of the decoded page, and (iii) apply an error correction code rate based on said selected histogram, wherein said error correction code rate allows said means for storing data to use a minimum number of error correction bits to provide reliable operation of said means for storing data.

11. An apparatus comprising:
    a memory configured to store data; and
    a controller configured to process a plurality of input/output requests to read/write data to/from said memory, wherein said controller is configured to (i) decode a page of data read from the memory, (ii) select one of a plurality of histograms based on a measured code word error rate of the decoded page, and (iii) apply an error correction code rate based on said selected histogram, wherein said error correction code rate allows said memory to use a minimum number of error correction bits to provide reliable operation of said memory.

12. The apparatus according to claim 11, wherein said apparatus comprises a solid state drive (SSD).

13. The apparatus according to claim 11, wherein said memory comprises a flash memory.

14. The apparatus according to claim 13, wherein said flash memory comprises a plurality of modules.

15. The apparatus according to claim 13, wherein said flash memory comprises a plurality of pages.

16. The apparatus according to claim 15, wherein said data stored in said plurality of pages is protected by data parity.

17. The apparatus according to claim 15, wherein said histograms comprise errors in said plurality pages statistically charted over a lifetime of said flash memory.

18. The apparatus according to claim 11, wherein allowing said memory to use a minimum number of error correction bits protects said data from corruption.

19. The apparatus according to claim 11, wherein allowing said memory to use a minimum number of error correction bits reduces a number of clock cycles needed to process errors.

20. The apparatus according to claim 11, wherein analysis of said plurality of histograms is based on a percentage threshold of an error distribution of said memory.

* * * * *